United States Patent
Chen et al.

(10) Patent No.: US 6,319,822 B1
(45) Date of Patent: Nov. 20, 2001

(54) PROCESS FOR FORMING AN INTEGRATED CONTACT OR VIA

(75) Inventors: Chao-Cheng Chen, Tainan; Chia-Shiung Tsai, Hsin-Chu; Shau-Lin Shue, Hsinchu; Hun-Jan Tao, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/164,999

(22) Filed: Oct. 1, 1998

(51) Int. Cl.$^7$ .................................. H01L 21/4763
(52) U.S. Cl. ..................... 438/637; 438/712; 438/681
(58) Field of Search ....................... 438/637, 712, 438/648, 656, 681; 430/313; 216/41

(56) References Cited

U.S. PATENT DOCUMENTS

| | | | |
|---|---|---|---|
| 4,444,618 | * 4/1984 | Saia et al. ........................ | 156/643 |
| 4,471,059 | * 9/1984 | Yoshino et al. .................. | 501/96 |
| 4,943,539 | * 7/1990 | Wilson et al. ................... | 438/629 |
| 5,254,213 | * 10/1993 | Tamaki ............................. | 156/655 |
| 5,254,499 | 10/1993 | Sandhu et al. .................. | 437/192 |
| 5,269,879 | * 12/1993 | Rhoades et al. ................ | 156/643 |
| 5,362,666 | 11/1994 | Dennison ......................... | 437/52 |
| 5,385,868 | 1/1995 | Chao et al. ...................... | 437/195 |
| 5,431,778 | * 7/1995 | Dahm et al. ..................... | 156/662.1 |
| 5,441,594 | * 8/1995 | Zenke .............................. | 156/643.1 |
| 5,480,684 | 1/1996 | Sandhu ............................ | 427/531 |
| 5,599,742 | * 2/1997 | Kadomura ....................... | 438/637 |
| 5,603,988 | 2/1997 | Shapiro et al. .................. | 427/248.1 |
| 5,612,240 | 3/1997 | Chang .............................. | 437/44 |
| 5,612,255 | * 3/1997 | Chapple-Sokol et al. ...... | 438/197 |
| 5,661,083 | * 8/1997 | Chen et al. ...................... | 438/637 |
| 5,706,067 | * 1/1998 | Colgan et al. ................... | 349/114 |
| 5,731,242 | * 3/1998 | Parat et al. ...................... | 438/586 |
| 5,759,921 | * 6/1998 | Rostoker .......................... | 438/711 |
| 5,882,996 | * 3/1999 | Dai .................................. | 438/597 |
| 5,891,799 | * 4/1999 | Tsui ................................. | 438/624 |
| 5,893,749 | * 4/1999 | Matumoto ....................... | 438/627 |
| 5,935,876 | * 8/1999 | Lee et al. ......................... | 438/738 |
| 5,942,803 | * 8/1999 | Shim et al. ...................... | 257/774 |
| 5,960,304 | * 9/1999 | McAnally et al. .............. | 438/597 |
| 5,968,846 | * 10/1999 | Chou et al. ...................... | 438/712 |
| 5,976,973 | * 11/1999 | Ohira et al. ..................... | 438/645 |
| 5,985,754 | * 11/1999 | Aizawa ............................ | 438/639 |
| 6,008,136 | * 12/1999 | Wada ............................... | 438/723 |
| 6,025,255 | * 2/2000 | Chen et al. ...................... | 438/595 |
| 6,025,273 | * 2/2000 | Chen et al. ...................... | 438/706 |

OTHER PUBLICATIONS

C.Y. Chang et al. "ULSI Technology" The McGraw–Hill Companies, New York, 1996, p388–389.

* cited by examiner

*Primary Examiner*—Olik Chaudhuri
*Assistant Examiner*—Ginette Peralta
(74) *Attorney, Agent, or Firm*—George O. Saile; Stephen B. Ackerman

(57) ABSTRACT

A method for etching of sub-quarter micron openings in insulative layers for contacts and vias is described. The method uses hardmask formed of carbon enriched titanium nitride. The hardmask has a high selectivity for etching contact and via openings in relatively thick insulative layers. The high selectivity requires a relatively thin hardmask which can be readily patterned by thin photoresist masks, making the process highly desirable for DUV photolithography. The hardmask is formed by MOCVD using a metallorganic titanium precursor. By proper selection of the MOCVD deposition conditions, a controlled amount of carbon is incorporated into the TiN film. The carbon is released as the hardmask erodes during plasma etching and participates in the formation of a protective polymer coating along the sidewalls of the opening being etched in the insulative layer. The protective sidewall polymer inhibits lateral chemical etching and results in openings with smooth, straight, and near-vertical sidewalls without loss of dimensional integrity.

27 Claims, 4 Drawing Sheets

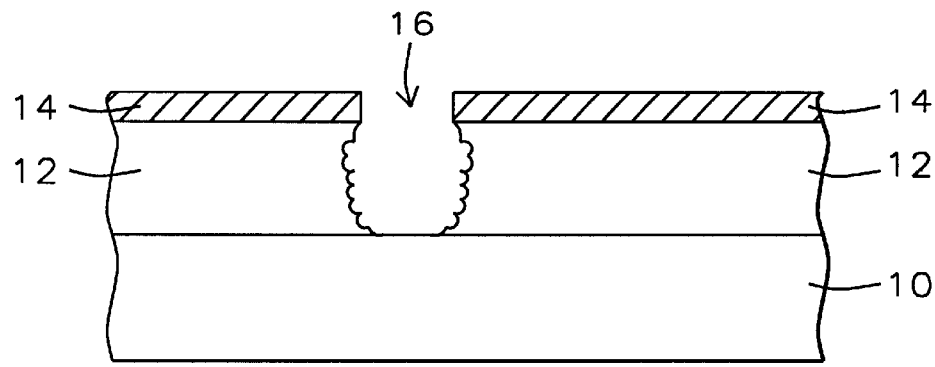
FIG. 1 - Prior Art
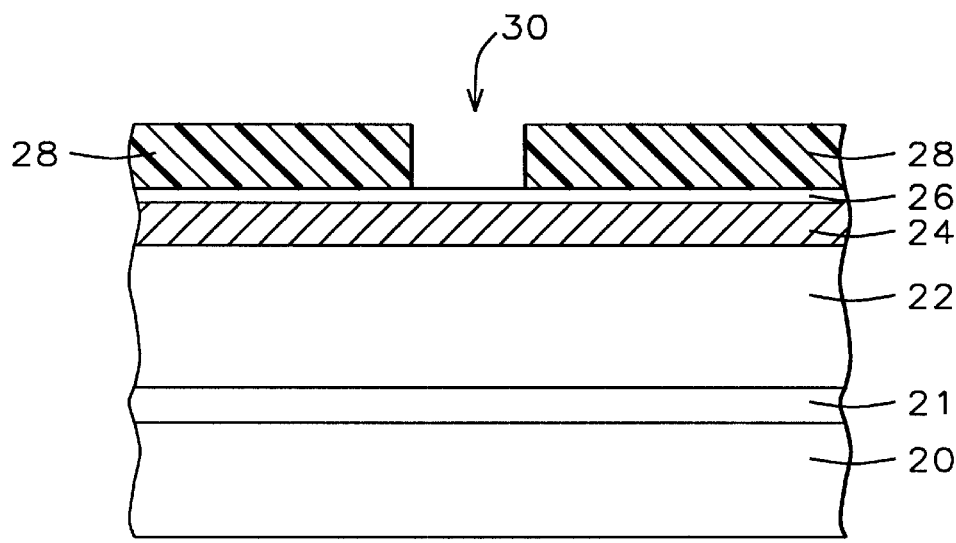
FIG. 2
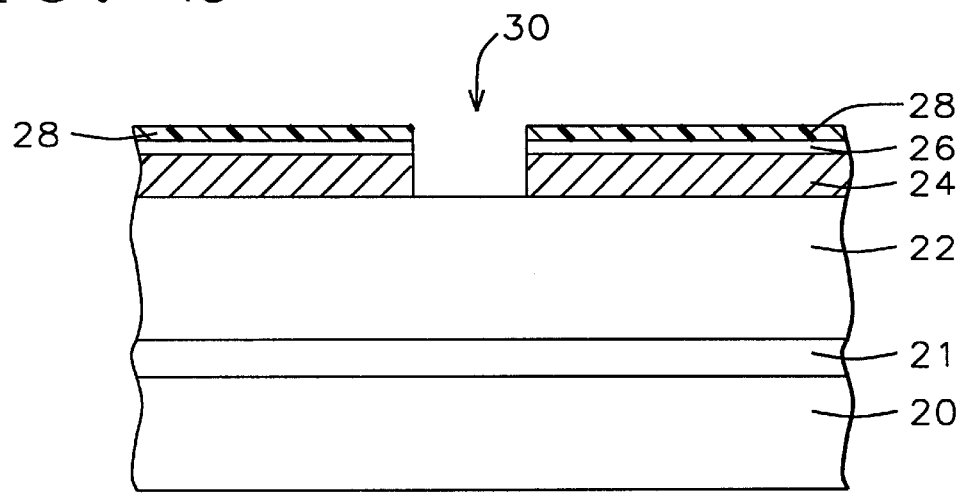
FIG. 3

PROCESS FOR FORMING AN INTEGRATED CONTACT OR VIA

BACKGROUND OF THE INVENTION (1) Field of the Invention

The invention relates to processes for the manufacture of semiconductor devices and more particularly to processes for forming contacts and Vias.

(2) Description of Prior Art

The integrated circuit (IC) manufacturing industry continues relentlessly towards smaller device geometries and greater circuit densities. This trend is made possible by the development of new manufacturing techniques as well as innovative improvements of existing procedures thereby extending their utility further towards miniaturization and higher density. The benefits and rewards of these efforts in very large scale integrated circuit technology development are extraordinary. Not only are the integrated circuits of today cheaper to produce, they continue to reward both end user and manufacturer with improved reliability and performance.

One such discipline wherein the limits of technology are constantly tested is the formation of openings in insulative layers wherein contacts to subjacent semiconductive elements are made. These openings generally represent the smallest photolithographically defined features of the integrated circuit. The openings are typically formed by reactive ion etching (RIE) through the insulative layer using a patterned photoresist mask. RIE is a well known anisotropic etching technique which can provide deep vertical openings having high aspect ratios. The aspect ratio in this regard is defined as the depth of the opening divided by its width.

The evolution in the capabilities of advanced optical lithography systems using laser light sources with wavelengths in the deep ultraviolet (DUV) spectrum has enabled the resolution of features below 0.25 microns. In spite of the improvements in lens quality, however, these resolutions come at the expense of very shallow depth of focus.

The formation of contact openings for sub-quarter micron IC technology requires such a fine photolithographic resolution. The narrow depth of focus dictates the use of photoresist layers having a thickness no greater than, and preferably less than the depth of focus. In order to achieve a resolution of less that 0.25 microns it is therefore necessary that the photoresist thickness be less than about 5,000 Angstroms. The etch rate selectivities of typically used insulative materials, such as silicon oxide and borophosphosilicate glass (BPSG), with respect to the photoresist materials used in deep-ultraviolet (DUV) photolithography are not sufficiently high to permit such thin photoresist layers to be used alone to accomplish the RIE patterning of contact or via openings.

Instead, a more durable material must be deposited over the insulative layer. This material is then patterned by a thin photoresist mask to form a hardmask. The hardmask material, having a substantially lower etch rate in the fluorocarbon gases used to etch the insulative layer, may be deposited relatively thinly and can therefore be easily patterned with a thin photoresist mask. One of the current inventors, has disclosed titanium nitride(TiN) as a material which forms an effective hardmask for etching of insulative layers and can be conveniently patterned with thin photoresist layers. Whereas the selectivity of silicon oxide to photoresist is only about 2–3:1, the selectivity of silicon oxide to TiN is about 10:1.

A problem with the use of sputtered TiN as a hardmask for anisotropic etching of ILD and IMD layers is that the sputter deposited TiN films lack the carbon content necessary for the formation of a protective polymer on the sidewalls of the contact/via openings during the plasma etch. As a result, the sidewalls are not vertical, suffer from unacceptable surface roughness and image distortion.

FIG. 1 is a cross section of a wafer 10 of with a contact opening 16 etched in an insulative layer 12 with a conventional fluorocarbon etchant containing $CF_4$ and $CHF_3$ using a sputtered TiN hardmask 14 which has been patterned by DUV photolithography. The sputtered TiN hardmask does not contain carbon and therefore a sidewall polymer is not formed during the insulator etching. The absence of sidewall protection permits lateral chemical etching resulting in rough and irregular wall surfaces as well as loss of image dimensional integrity.

The use of hardmasks for patterning layers by plasma etching is not new. Dennison, U.S. Pat. No. 5,362,666 shows a method of producing a self-aligned contact penetrating a cell plate using a silicon nitride or polysilicon hardmask to etch a contact hole. Chang, U.S. Pat. No. 5,612,240 shows a contact method using a silicon nitride spacer as a hardmask.

MOCVD(metal organic chemical vapor deposition) methods for forming conductive layers have been reported. For example Chao, et.al, U.S. Pat. No. 5,385,868 cites the formation of aluminum/silicon and aluminum/copper alloy layers by MOCVD. Sandhu, U.S. Pat No. 5,254,499 cites the formation of conformal high density TiN barrier layer films by MOCVD. Shapiro, et.al. U.S. Pat. No. 5,603,988 likewise cites the formation of TaN and TiN films by MOCVD. Generally, the carbon content of these films is problematic because it causes the films to be more resistive than sputtered TaN and TiN films. The predominant use of these films is for metal diffusion barriers in contacts. In this application a high conductivity is sought. Sandhu, U.S. Pat. No. 5,480,684 cites a method for reducing the carbon content of MOCVD TiN films from 21 atomic percent to 12 atomic percent by ion implantation of ions of a "late transition metal", for example platinum, into the MOCVD TiN followed by annealing in hydrogen.

C. Y. Chang and S. M. Sze, in ULSI Technology, McGraw-Hill, New York, (1996) p.388–389 cite the formation of MOCVD TiN films from TDMAT and TDEAT precursors, indicating that these films have low densities and high resistivities because of carbon and oxygen inclusion, compared with sputtered TiN films making them unsuitable as barrier layers.

In the current invention, wherein MOCVD TiN films are used as hardmasks, the incorporated carbon is used advantageously to form a protective sidewall polymer coating during RIE of insulative layers. Conductivity and high conformality are of little or no consequence to a RIE hardmask.

SUMMARY OF THE INVENTION

Accordingly, it is an object of this invention to provide an improved TiN hardmask for forming contact or via openings in sub-micron integrated circuits using thin photoresist thereby gaining full benefit of the 250 nm. or better resolution available with DUV photolithography.

It is another object of this invention to provide a method for forming a high etch rate selectivity RIE hardmask for etching patterns in insulative layers.

It is another object of this invention to provide a method for forming a carbon enriched TiN hardmask for etching oxide films with etchants containing fluorocarbons without mask undercutting and sidewall roughness caused by lack of polymer formation.

It is another object of this invention to provide a method for introducing a controlled amount of carbon into an inorganic hardmask material so that sidewall protective polymer is formed when the hardmask is used to anisotropically etch silicaceous layers.

These objects are accomplished by forming a carbon enriched refractory metal nitride hardmask by MOCVD. The metal organic precursors provide sufficient carbon in the deposited nitride hardmask which is released as the hardmask erodes during plasma etching. The released carbon participates in the formation of a polymer layer along the sidewalls of the silicaceous material being etched, thereby preventing lateral erosion by chemical reaction. The hardmask material disclosed by the embodiments of the current invention is $TiN_xC_y$ and is formed by MOCVD using tetrakis-(dimethylamido)-titanium (TDMAT) or tetrakis (diethylamido)-titanium (TDEAT) precursors. The $TiN_xC_y$ films can be deposited at temperatures between about 250 and 480° C. The carbon content of the MOCVD TiN films can be adjusted from about 5% to 20% by variation of the deposition conditions.

The incorporated carbon in the MOCVD $TiN_xC_y$ films is used advantageously by this invention in forming a protective polymer coating on the sidewalls of contact or via openings in ILD and IMD layers during the anisotropic etching. The carbon content of these MOCVD films may be controlled by plasma annealing.

BRIEF DESCRIPTION OF THE DRAWINGS

FIG. 1 is a cross section of a contact opening formed in an ILD layer using a TiN hardmask formed by sputtering.

FIGS. 2 through FIG. 4 are a cross sections illustrating processing steps used in a first embodiment of this invention.

DESCRIPTION OF THE PREFERRED EMBODIMENTS

Figure 4:
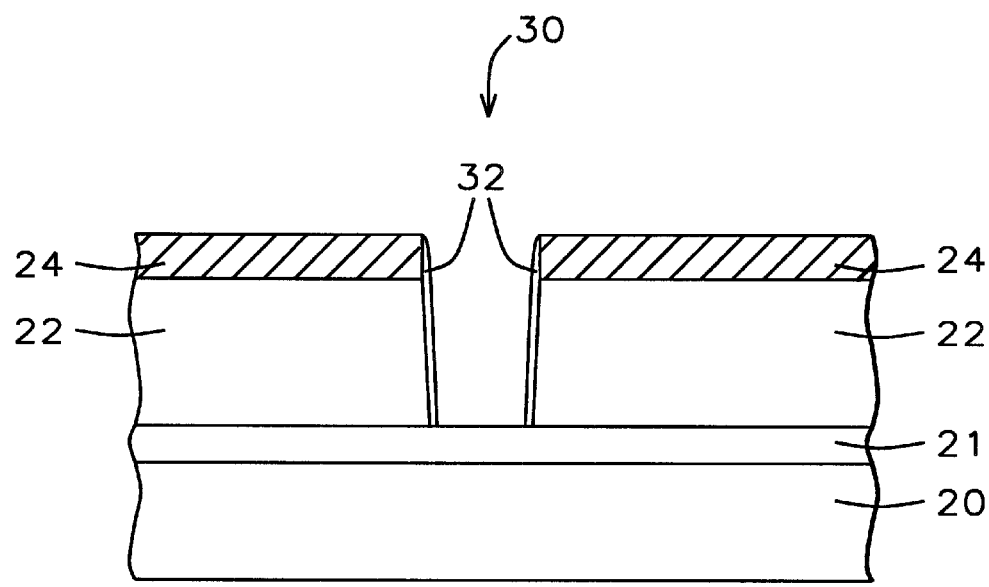

In a first embodiment of this invention a contact opening is formed to a semiconductive element by etching an inter-level dielectric layer(ILD) using a hardmask formed of $TiN_xC_y$. Contact openings having aspect ratios between about 1.5 and 5 may be formed by the process of this embodiment. The $TiN_xC_y$ hardmask is formed by MOCVD and is patterned by DUV photolithography using thin photoresist.

Referring to FIG. 2 a p-type, monocrystalline silicon wafer 20 is provided. Semiconductor devices, for example, MOSFETs and bipolar transistors, are formed within the surface of wafer 20. A region 21 is an element of such a device, for example a source or drain of a MOSFET, to which an electrical contact is to be formed. The devices, which may also have elements(not shown) formed over the silicon wafer surface, for example insulated gate structures, are typically isolated by regions of field oxide(not shown). The devices are formed according to procedures well known and widely practiced by those in the art.

An ILD layer 22 comprising silicon oxide is formed over the wafer 20 to a thickness of between about 2,000 to 5,000 Angstroms. The deposition is performed preferably by low pressure chemical vapor deposition(LPCVD) using tetraethylorthosilicate(TEOS) as a precursor. Alternatively the ILD layer 22 may be formed of other insulative materials, for example, phosphosilicate glass (PSG), borophosphosilicate glass (BPSG) or combination of silicon oxide and BPSG or PSG. The layer 22 may alternatively be formed by other deposition methods, for example, plasma enhanced chemical vapor deposition(PECVD). The formation of such layers or films is common in the semiconductor industry and the deposition procedures are familiar to those in the art.

A layer 24 comprising $TiN_xC_y$ is next deposited over the ILD layer 22 by a MOCVD process using TDMAT as a precursor. Alternatively, other titanium organometallic precursors, for example TDEAT, may be employed. The substrate is maintained at a temperature of between about 400 and 450° C. in a conventional MOCVD tool. A carrier gas, preferably He or $N_2$ is bubbled at a flow rate of between about 275 and 300 SCCM (Standard cubic centimeters per minute) through a reservoir of TDMAT contained in a vessel and heated to a temperature of about 60° C. The layer 24 is deposited to a thickness between about 1,000 and 3,000 Angstroms. The selected thickness depends upon the etch depth in layer to which the hardmask is applied.

The carbon content of the resultant film can be adjusted to between about 5 to 20 atomic % by in-situ plasma annealing in the MOCVD chamber in which the film is deposited. The annealing is accomplished in a gas mixture containing $N_2$ at a flow rate of 200 SCCM or thereabout and $H_2$ at a flow rate of 100 SCCM or thereabout at a chamber pressure of 1.3 Torr or thereabout. The substrate temperature is maintained at about 400° C. and the rf power at 750 Watts or thereabout. The optimal carbon enrichment is determined by experiment to accommodate the subsequent etchant chemistry and the polymer formation rate.

A bottom anti reflective coating (BARC) layer 26 is next deposited over the $TiN_xC_y$ layer 24. The BARC layer 26, preferably an organic BARC layer, is deposited by well known spin coating procedures. A thin photoresist layer 28 between about 1,000 and 8,000 Angstroms thick is deposited over the $TiN_xC_y$ layer 24. The photoresist 28 is patterned to define a contact opening 30 using well known photolithographic procedures, preferably high resolution (less than 0.25 micron) DUV photolithography.

Referring now to FIG. 3, the substrate wafer 20 is loaded into an RIE tool.

The BARC layer 26 and the $TiN_xC_y$ layer 24 are etched by RIE using well known TiN etchant gas mixtures, for example mixtures containing HBr, $BCl_3$, fluorocarbon gases, and/or $Cl_2$ Endpoint is detected, preferably by optical emission spectroscopy, detecting the appearance $O_2$ which signals the exposure of the ILD layer 22. Alternatively a timed etch period may be employed. The $TiN_xC_y$ hardmask is now patterned. The residual photoresist 28 and the BARC layer 26 are stripped preferably by plasma ashing or alternatively by liquid strippers. These procedures are well known to those familiar with the art and are comparable to the etching procedures used to pattern TiN.

Referring now to FIG. 4, the contact opening 30 is formed in the ILD layer 22 by RIE using the $TiN_xC_y$ hardmask 24. The etching is accomplished using a mixture of fluorocarbons containing, for example, $CF_4$, $C_2F_6$, $C_4F_8$, $CHF_3$ or combinations thereof. The respective flow rates and etching parameters are experimentally optimized by etchant and parameter selection to obtain high etch rate selectivities for the ILD layer material with respect to the $TiN_xC_y$ hardmask. These optimization procedures are well known to those skilled in the art. In the current embodiment a gas mixture consisting of $CHF_3$ at 60 SCCM(standard cubic centimeters per minute), $CF_4$ at 30 SCCM or thereabout, Argon at 100 SCCM or thereabout, and $N_2$ at 20 SCCM or thereabout is used to etch the opening shown in FIG. 5. The total chamber pressure is maintained at 150 mTorr or thereabout.

As the $TiN_xC_y$ hardmask 24 erodes during RIE, carbon from the hardmask reacts with the etchant gases to form a carbonaceous polymer 32 which deposits along the sidewalls of the opening 30 being etched in the ILD layer 22. The polymer 32 protects the sidewalls from lateral chemical etching in a similar manner as does the polymer formed when an ILD layer is etched using a photoresist mask. The formation of a protective sidewall polymer during RIE of oxide layers with photoresist masking is widely accepted. The ability to achieve smooth, near vertical sidewalls is generally attributed to this protective polymer.

Figure 5:
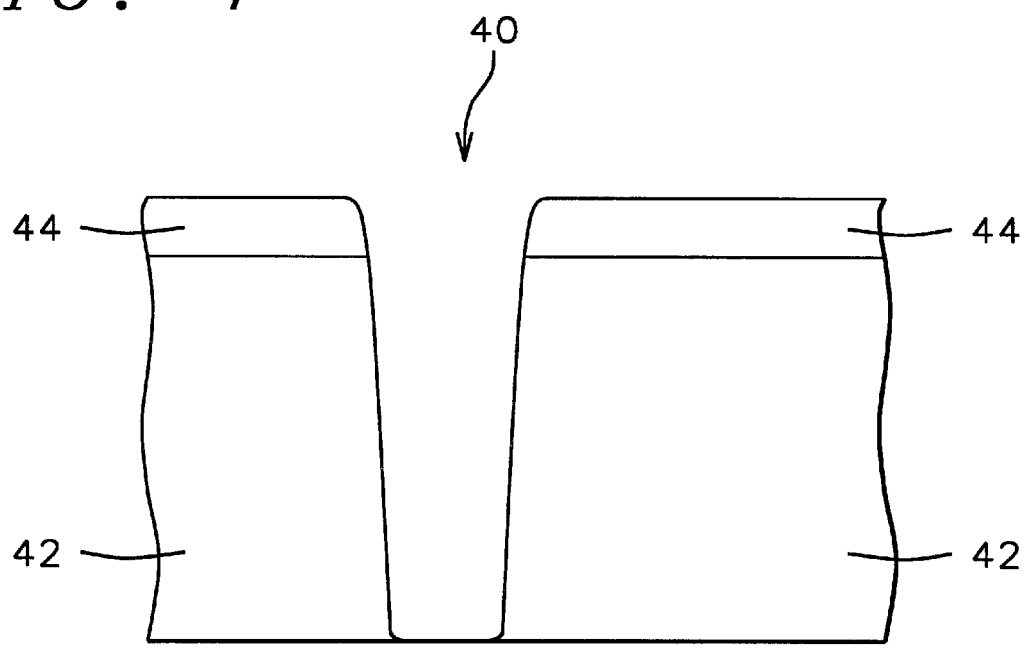
FIG. 5 is a line drawing made from a scanning electron micrograph showing a cross section of a contact opening made according to the first embodiment of this invention.

The cross section of the ILD opening 30 as depicted in FIG. 4 is typical of the shape of contact openings formed in the ILD layer using a $TiN_xC_y$ hardmask formed according to the method of this invention. FIG. 5 is a drawing made from a scanning electron micrograph showing a contact opening 40 etched in a 1,05 micron thick silicon oxide layer 42 using a 1,400 Å thick $TiN_xC_y$ hardmask 44. Much of the hardmask 44 still remains. However, the high carbon content of the hardmask of between about 5 and 12 atomic percent was sufficient to form adequate sidewall polymer protection so that a smooth, near vertical contact opening 40 was formed. The dimension at the base of the opening 40 is 0.6 microns. An etchant gas consisting of $CHF_3$ at 60 SCCM(standard cubic centimeters per minute), $CF_4$ at 30 SCCM, Argon at 100 SCCM, and $N_2$ at 20 SCCM was used to etch the opening 40. The total chamber pressure was 150 mTorr.

Figure 6:
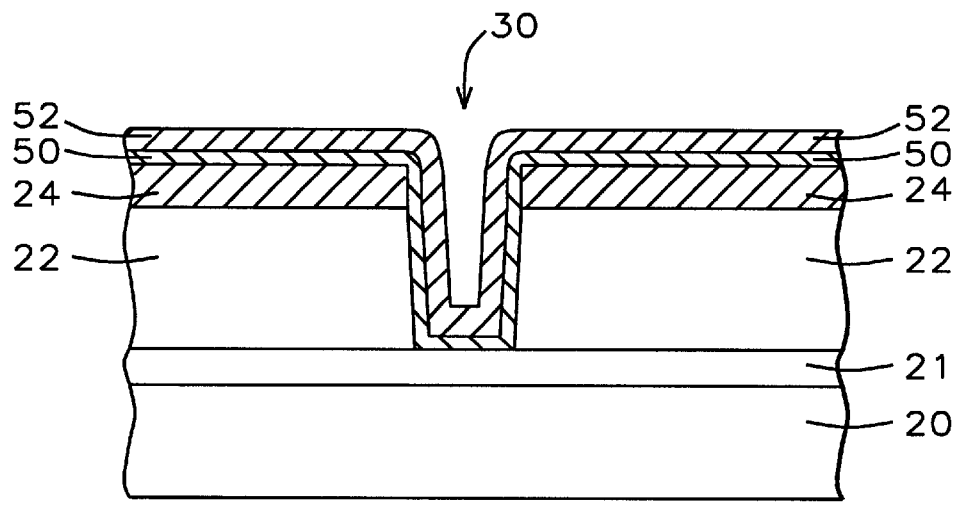
FIGS. 6 and 7 are a cross sections illustrating additional processing steps used in a first embodiment of this invention.

Referring back to FIG. 4, the polymer 32 formed during RIE of the contact opening 30, is removed by a liquid stripper or, alternatively, by plasma ashing. These procedures are well know by those in the art. After the polymer removal a Ti/TiN glue/barrier layer is formed, preferably by sputtering. The formation of glue/barrier layers to line the walls of contact openings is well known and widely practiced in the art. Referring now to FIG. 6 a layer of titanium 50, between about 100 and 800 Angstroms thick, is deposited over the wafer 20 and into the opening 30. This is immediately followed by a barrier layer of TiN 52 deposited in the same tool without breaking vacuum. The TiN layer 52 is between about 300 and 500 Angstroms thick.

Figure 7:
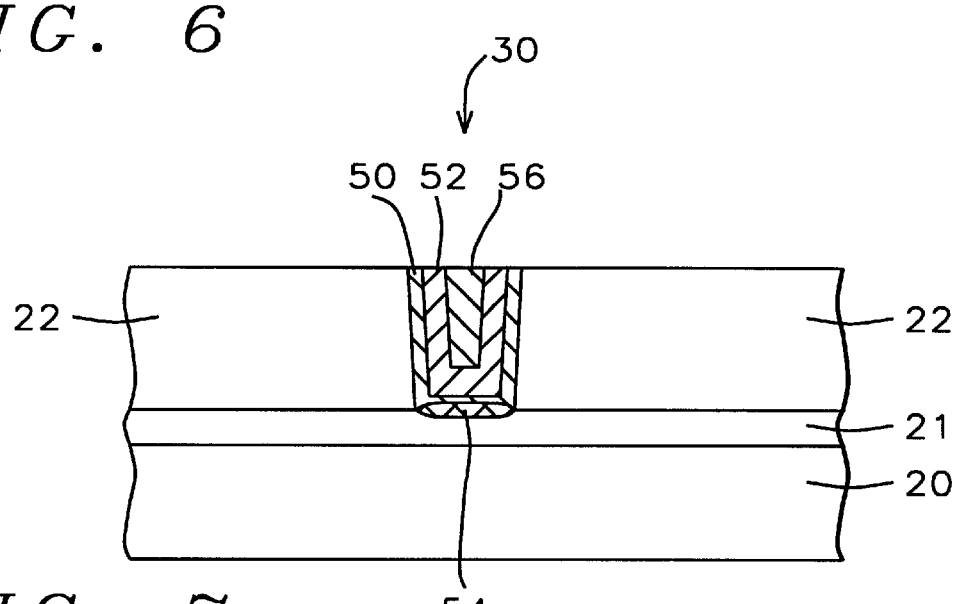

Referring to FIG. 7, the wafer 20 is then subjected to a rapid thermal annealing procedure in nitrogen wherein the Ti layer 50 at the base of the opening 30 reacts with the substrate silicon to form a titanium silicide bonding layer 54. A tungsten plug contact 56 is next formed in the opening 30 by conventional methods well known to those skilled in the art. A layer of LPCVD tungsten is deposited over the wafer to fill the contact opening 30. The tungsten layer is then blanket etched by RIE until the ILD layer 22 is exposed leaving a tungsten plug contact 56 in the opening 30.. The etchant gases used for the tungsten RIE contain chlorine and also etch away the residual $TiN_xC_y$ hardmask 24.

In a second embodiment of this invention a via opening is formed in a inter metal dielectric(IMD) layer exposing a subjacent conductive element of an integrated circuit interconnection level. The interconnection level used in the present embodiment is an aluminum wiring pattern although vias openings to other patterned conductive materials, for example polysilicon or copper, may also formed by the method of this embodiment. Via openings having aspect ratios between about 1 and 4 may be formed by the process of this embodiment. A $TiN_xC_y$ hardmask is used to form the via. An organic BARC layer is next deposited over the $TiN_xC_y$ layer. After the opening is etched, the residual hardmask remaining after the via has been etched is subsequently removed during the steps which form the via fill metallization.

Figure 8:
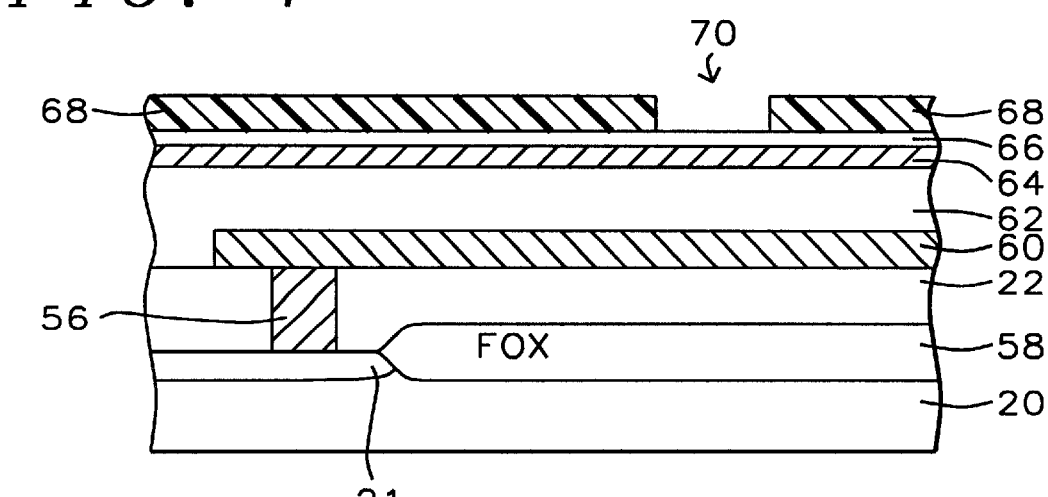
FIG. 8 through FIG. 10 are a cross sections illustrating processing steps used in a second embodiment of this invention.

Referring to FIG. 8, an p-type, monocrystalline silicon wafer 20 is provided. Semiconductor devices, for example, MOSFETs and bipolar transistors(not shown), are formed within the surface of wafer 20. FIG. 8 shows an active region 21 of a semiconductor device which is isolated by as region of field oxide 58. The procedures for the formation of semiconductor devices and the regions of field oxide are well known by those skilled in the art.

An ILD layer 22 comprising silicon oxide is formed over the wafer 20 to a thickness of between about 2,000 to 5,000 Angstroms. The deposition is performed preferably by low pressure chemical vapor deposition(LPCVD) using tetraethylorthosilicate(TEOS) as a precursor. Alternatively the ILD layer 22 may be formed of other insulative materials, for example, phosphosilicate glass (PSG), borophosphosilicate glass (BPSG) or combination of silicon oxide and BPSG or PSG. The layer 22 may alternatively be formed by other deposition methods, for example, plasma enhanced chemical vapor deposition(PECVD). The formation of such layers or films is common in the semiconductor industry and the deposition procedures are familiar to those in the art. A tungsten plug contact 56 is formed to the active element 21 preferably by the method described in the first embodiment of this invention.

An aluminum metallization layer 60 is deposited on the insulative layer 22 using methods well known to those skilled in the art, for example, by sputtering or by vacuum evaporation. The layer 60 is then patterned using well known photolithographic procedures commensurate with the technology. The interconnective metallization layer 60, as used in this embodiment is a first interconnective layer and is electrically connected to semiconductive device element 21 through the contact 56.

An inter metal dielectric (IMD) layer 62, preferably comprising BPTEOS (a BPSG formed from using a TEOS precursor) deposited over the patterned metallization layer 60. The IMD layer may alternatively be formed of another insulative material, for example silicon oxide. The IMD layer 62 is formed by LPCVD although PECVD may alternatively be used. The formation of IMD layers is a well known procedure in the manufacture of integrated circuits and the insulative material chosen for this application is typically some form of silicate glass. The IMD layer 62 is between about 5,000 and 15,000 Angstroms thick.

A layer 64 comprising $TiN_xC_y$ is next deposited over the IMD layer 62 by a MOCVD process using TDMAT as a precursor. Alternatively other titanium organometallic precursors, for example TDEAT, may be employed. The layer 24 is deposited to a thickness between about 1,000 and 3,000 Angstroms.

A bottom anti reflective coating (BARC) layer 66 is next deposited over the $TiN_xC_y$ layer 64. The BARC layer 66, preferably an organic BARC layer, is deposited by well known spin coating procedures. A thin photoresist layer 68 between about 1,000 and 8,000 Angstroms thick is deposited over the TiN$_x$C$_y$ layer 64. The photoresist 68 is patterned to define a via opening 70 using well known photolithographic procedures, preferably high resolution (less than 0.25 micron) DUV photolithography.

Figure 9:
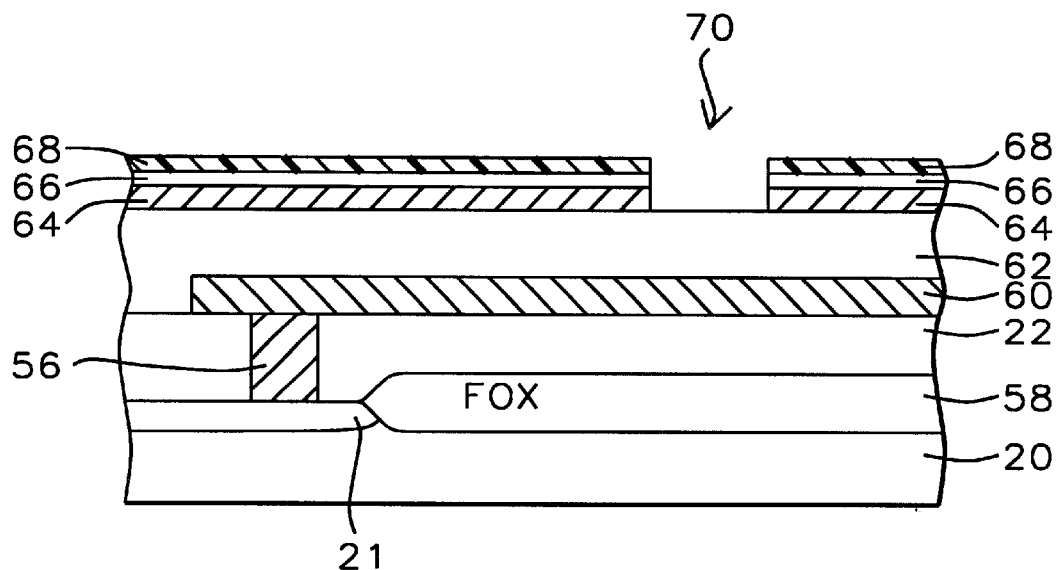

Referring now to FIG. 9, the wafer 20 is mounted the chamber of an RIE tool and the BARC layer 66 and the TiN$_x$C$_y$ layer 64 are etched using well known TiN etchant gas mixtures, for example mixtures containing HBr, BCl$_3$, and/or Cl$_2$. Endpoint is detected, preferably by optical emission spectroscopy, detecting the appearance O$_2$ which signals the exposure of the IMD layer 62. Alternatively a timed etch period may be employed. The residual photoresist 68 and the BARC layer 66 are stripped preferably by plasma ashing or alternatively by commercially available liquid strippers leaving behind the patterned TiN$_x$C$_y$ hardmask 24. These procedures are well known to those familiar with the art.

Figure 10:
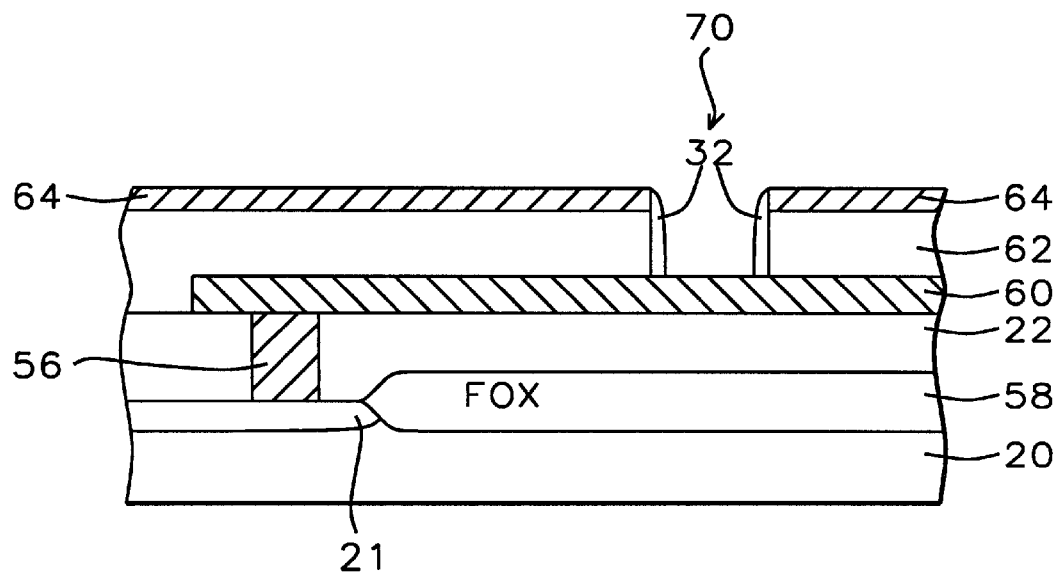

Referring now to FIG. 10, the via opening 70 is formed in the IMD layer 62 by RIE using the TiN$_x$C$_y$ hardmask 64. The etching is accomplished using a mixture of fluorocarbons containing, for example, CF$_4$, C$_2$F$_6$, C$_4$F$_8$, CHF$_3$ or combinations thereof. The respective flow rates and etching parameters are experimentally optimized by etchant and parameter selection to obtain high etch rate selectivities for the IMD layer material with respect to the TiNXCY hardmask. These optimization procedures are well known to those skilled in the art. In the current embodiment a gas mixture consisting of CHF$_3$ at 60 SCCM(standard cubic centimeters per minute), CF$_4$ at 30 SCCM or thereabout, Argon at 100 SCCM or thereabout, and N$_2$ at 20 SCCM or thereabout is used. The total chamber pressure is maintained at 150 mTorr or thereabout.

As the TiN$_x$C$_y$ hardmask 64 erodes during RIE, carbon from the hardmask reacts with the etchant gases causing a carbonaceous polymer 32 to deposit along the sidewalls of the opening 70 in the IMD layer 62. The polymer 32 protects the sidewalls from lateral chemical etching in a similar manner as does the polymer formed when an IMD layer is etched using a photoresist mask. The formation of a protective sidewall polymer during RIE of oxide layers with photoresist masking is widely accepted. The ability to achieve smooth, near vertical sidewalls is generally attributed to this protective polymer. After the etching is completed the polymer 32 is removed by a commercially available liquid stripper or by plasma ashing. These procedures are well know by those in the art.

The next metallization level wiring (not shown) is then patterned and connected to the first metallization level wiring 60 either by means of a tungsten plug formed in a similar manner as the plug 56 or by deposition of the next metallization layer material directly into the via opening 70.

The via formed in the second embodiment interconnects a first metallization level with a second. Integrated circuits can have additional metallization levels. It should be understood that The method of the second embodiment can be equally applied to vias between any two metallization levels.

The preferred embodiments of this invention teach the formation of sub-quarter micron contacts using high resolution DUV photolithography. By using a thin layer of photoresist, full advantage of the high resolution photolithography can be realized to pattern a hardmask. At the same time the hardmask provides a high selectivity for etching the insulative layer. In addition the hardmask also provides sufficient carbon to plasma etching ambient to cause the formation of a protective polymer along the sidewalls of the opening thereby greatly improving the surfaces of the opening as well as maintaining the dimensional integrity of the mask.

While the invention has been particularly shown and described with reference to the preferred embodiments thereof, it will be understood by those skilled in the art that various changes in form and details may be made without departing from the spirit and scope of the invention.

Whereas the embodiments of this invention utilize a p-type silicon substrate, an n-type silicon substrate could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for etching an opening in an insulative layer on a semiconductor wafer comprising:
   (a) providing a substrate having an insulative layer in which said opening is to be formed;
   (b) forming a carbon enriched refractory metal nitride layer over said insulative layer by metal organic chemical vapor deposition (MOCVD);
   (c) patterning said carbon enriched refractory metal nitride layer to define an opening thereby forming a hardmask; and
   (d) etching said insulative layer by reactive ion etching thereby forming an opening in said insulative layer, and whereby carbon released from said hardmask reacts with etchant gases causing a protective carbonaceous polymer to form on the sidewalls of said opening.

2. The method of claim 1 wherein said insulative layer is taken from the group consisting of silicon oxide, a borosilicate glass and a borophosphosilicate glass.

3. The method of claim 1 wherein said insulative layer is between about 2,000 and 15,000 Angstroms thick.

4. The method of claim 1 wherein said opening in said insulative layer has an aspect ratio of between about 1.5 and 5.

5. The method of claim 1 wherein said carbon enriched refractory metal nitride layer comprises essentially TiN$_x$C$_y$ having a thickness between about 1,000 and 3,000 Angstroms.

6. The method of claim 5 wherein said TiN$_x$C$_y$ is formed by MOCVD at a temperature of between about 240 and 480° C. from a titanium organometallic precursor.

7. The method of claim 5 wherein said TiN$_x$C$_y$ contains between about 5 and 12 atomic percent carbon.

8. The method of claim 1 wherein said carbon enriched refractory metal nitride layer is patterned with photoresist and etched by reactive ion etching using an etchant selected from the group consisting of HBr, BCl$_3$, Cl$_2$, O$_2$ and a fluorocarbon or a combination of two or more etchants from said group.

9. The method of claim 8 wherein said photoresist is between about 1,000 and 5,000 Angstroms thick.

10. A method for forming a contact to a semiconductive device on a silicon wafer comprising:
   (a) providing a silicon wafer having a semiconductive device formed in its surface and an insulative layer formed over said semiconductive device;
   (b) depositing a carbon enriched refractory metal nitride layer over said insulative layer by metal organic chemical vapor deposition (MOCVD);
   (c) patterning said carbon enriched refractory metal nitride layer to define a contact opening thereby forming a hardmask;
   (d) etching said insulative layer by reactive ion etching, thereby forming said contact opening in said insulative layer, whereby carbon, released from said hardmask, reacts with etchant gases causing a protective carbonaceous polymer to form on the sidewalls of said contact opening;

(e) stripping said polymer; and (f) forming a contact plug in said contact opening.

11. The method of claim 10 wherein said insulative layer is taken from the group consisting of silicon oxide, a borosilicate glass and a borophosphosilicate glass.

12. The method of claim 10 wherein said insulative layer is between about 2,000 and 15,000 Angstroms thick.

13. The method of claim 10 wherein said contact opening has an aspect ratio of between about 1.5 and 5.

14. The method of claim 10 wherein said carbon enriched refractory metal nitride layer comprises essentially $TiN_xC_y$ having a thickness between about 1,000 and 3,000 Angstroms.

15. The method of claim 14 wherein said $TiN_xC_y$ is formed by MOCVD at a temperature of between about 250 and 480° C. from a titanium organometallic precursor.

16. The method of claim 14 wherein said $TiN_xC_y$ contains between about 5 and 12 atomic percent carbon.

17. The method of claim 10 wherein said carbon enriched refractory metal nitride layer is patterned with photoresist and etched by reactive ion etching using an etchant selected from the group consisting of HBr, $BCl_3$, $Cl_2$, $O_2$ and a fluorocarbon or a combination of two or more etchants from said group.

18. The method of claim 17 wherein said photoresist is between about 1,000 and 5,000 Angstroms thick.

19. A method for forming a via opening in an insulative layer on a silicon wafer comprising:

(a) providing a silicon wafer having integrated circuit devices formed in its surface, an interconnection metallization layer, and an insulative layer formed on said metallization layer;

(b) forming a carbon enriched refractory metal nitride layer over said insulative layer by metal organic chemical vapor deposition (MOCVD);

(c) patterning said carbon enriched refractory metal nitride layer to define a via opening over a portion of said metallization layer thereby forming a hardmask;

(d) etching said insulative layer by reactive ion etching, thereby forming a via opening in said insulative layer, exposing said metallization layer, and whereby carbon, released from said hardmask, reacts with etchant gases to form a protective carbonaceous polymer on the sidewalls of said via opening; and (e) stripping said polymer.

20. The method of claim 19 wherein said insulative layer is taken from the group consisting of silicon oxide, a borosilicate glass and a borophosphosilicate glass.

21. The method of claim 19 wherein said insulative layer is between about 2,000 and 15,000 Angstroms thick.

22. The method of claim 19 wherein said contact opening has an aspect ratio of between about 1 and 4.

23. The method of claim 19 wherein said carbon enriched refractory metal nitride layer comprises essentially $TiN_xC_y$ having a thickness between about 1,000 and 3,000 Angstroms.

24. The method of claim 23 wherein said $TiN_xC_y$ is formed by MOCVD at a temperature of between about 250 and 480° C. from a titanium organometallic precursor.

25. The method of claim 23 wherein said $TiN_xC_y$ contains between about 5 and 12 atomic percent carbon.

26. The method of claim 19 wherein said carbon enriched refractory metal nitride layer is patterned with photoresist and etched by reactive ion etching using an etchant selected from the group consisting of HBr, $BCl_3$, $Cl_2$, $O_2$ and a fluorocarbon or a combination of two or more etchants from said group.

27. The method of 26 claim wherein said photoresist is between about 1,000 and 5,000 Angstroms thick.

* * * * *